United States Patent
Wang

(10) Patent No.: US 8,612,034 B2
(45) Date of Patent: *Dec. 17, 2013

(54) PRINTED CIRCUIT BOARD

(75) Inventor: Cheng-Sung Wang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 622 days.

This patent is subject to a terminal disclaimer.

(21) Appl. No.: 12/843,062

(22) Filed: Jul. 26, 2010

(65) Prior Publication Data

US 2012/0020500 A1    Jan. 26, 2012

(30) Foreign Application Priority Data

Jul. 22, 2010    (TW) .............................. 99124087 A

(51) Int. Cl.
*G06F 17/00* (2006.01)
(52) U.S. Cl.
USPC ............. 700/94; 361/760; 361/780; 361/782; 361/818
(58) Field of Classification Search
USPC ........................................................ 700/94
See application file for complete search history.

(56) References Cited

U.S. PATENT DOCUMENTS

| | | | |
|---|---|---|---|
| 5,587,920 A * | 12/1996 | Muyshondt et al. | 716/137 |
| 6,557,154 B1 * | 4/2003 | Harada et al. | 716/115 |
| 2006/0221585 A1 * | 10/2006 | Brench | 361/780 |

FOREIGN PATENT DOCUMENTS

| | | |
|---|---|---|
| CN | 101005731 A | 7/2007 |
| CN | 200990726 Y | 12/2007 |
| TW | I252637 B | 4/2006 |
| TW | 200733864 A | 9/2007 |

* cited by examiner

*Primary Examiner* — Andrew C Flanders
*Assistant Examiner* — David Siegel
(74) *Attorney, Agent, or Firm* — Altis Law Group, Inc.

(57) ABSTRACT

A printed circuit board includes a first signal layer, a first ground layer, a second signal layer, a power layer, a second ground layer, and a third signal layer. The first signal layer includes an analog audio input/output (I/O) port and an audio chip. The audio chip includes a main body, a first group of signal pins connected to the analog audio I/O port, and a second group of signal pins connected to a control chip. The first ground layer, the power layer, and the second ground layer are each divided into an audio part and a digital part. The three audio parts act as a reference plane for traces between the analog audio I/O port and the audio chip, the three digital parts act as reference planes for traces between the control chip and the audio chip.

10 Claims, 3 Drawing Sheets

PRINTED CIRCUIT BOARD

CROSS-REFERENCE OF RELATED APPLICATION

This application claims the priority benefit of Taiwan application No, 9912408, filed on Jul. 22, 2010.

Relevant subject matters are disclosed in a co-pending U.S. patent application with application Ser. No. 12/843,063, filed on the same date and having the same title, which are assigned to the same assignee as this patent application,

BACKGROUND

1. Technical Field

The present disclosure relates to a printed circuit board (PCB).

2. Description of Related Art

Nowadays, some PCBs, such as computer motherboards, include analog audio input/output (I/O) ports, such as those for a microphone and speaker. The analog audio I/O ports are connected to an audio chip through some audio traces in the PCBs, however, these audio traces easily pick up noise signals from other circuits or reference layers of the PCBs. Furthermore, if the I/O ports are antennas, the noise signals can be emitted through the I/O ports, which can produce electro magnetic interference (EMI) problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references may mean at least one.

Figure 1:
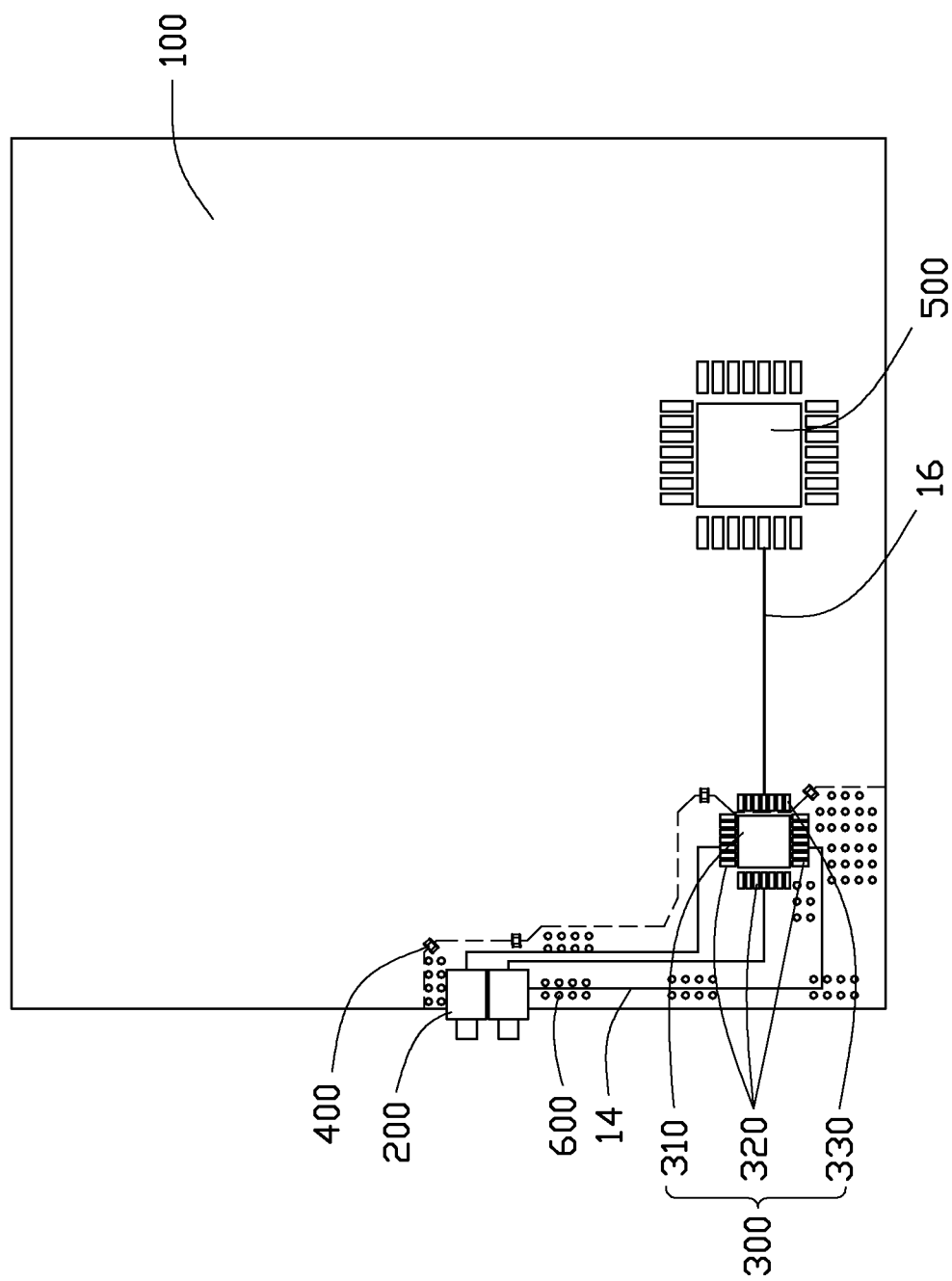
FIG. 1 is a schematic view of an embodiment of a printed circuit board (PCB), the PCB includes a first ground layer.
Figure 2:
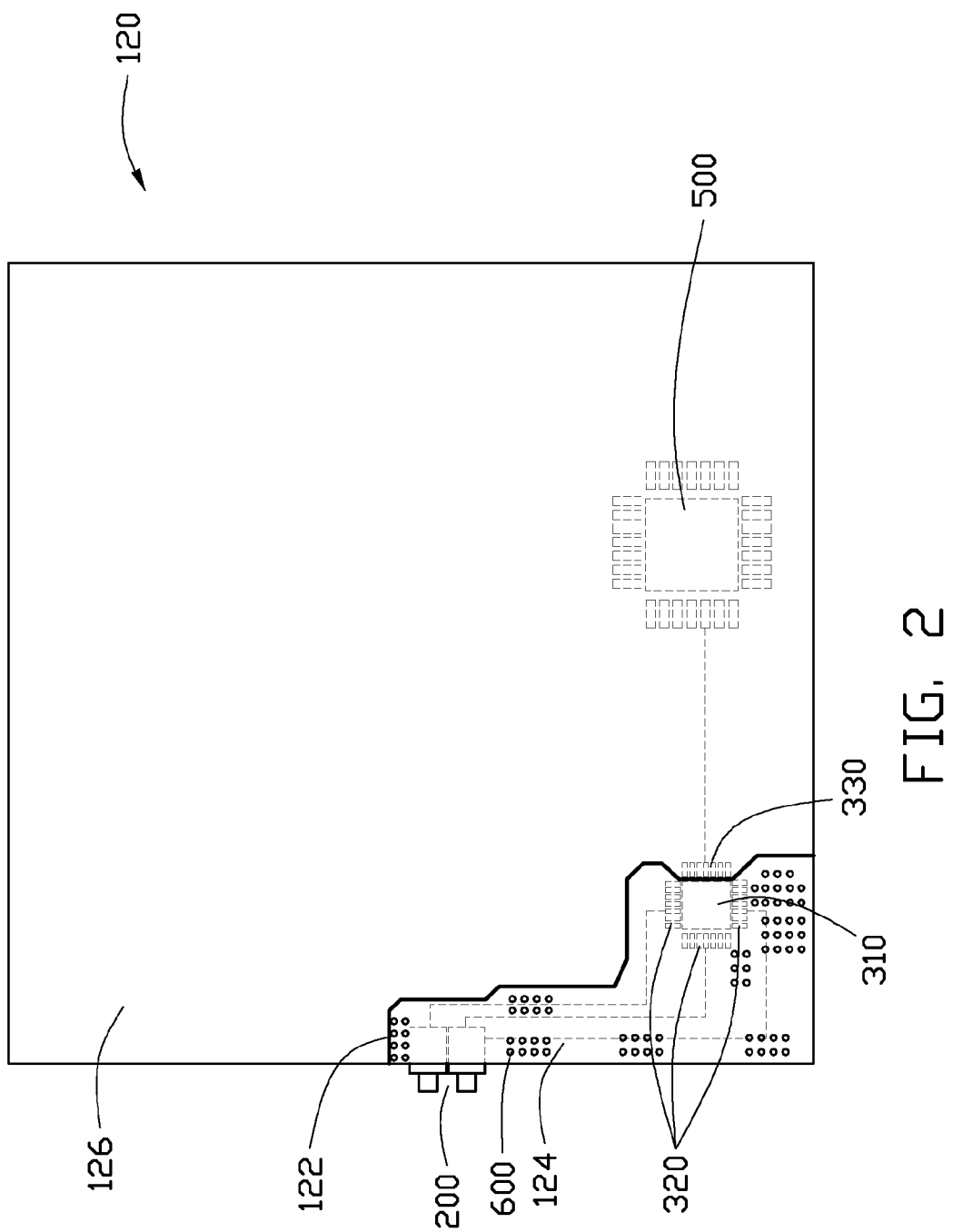
FIG. 2 is a schematic view of the first ground layer of the PCB of FIG. 1.
Figure 3:
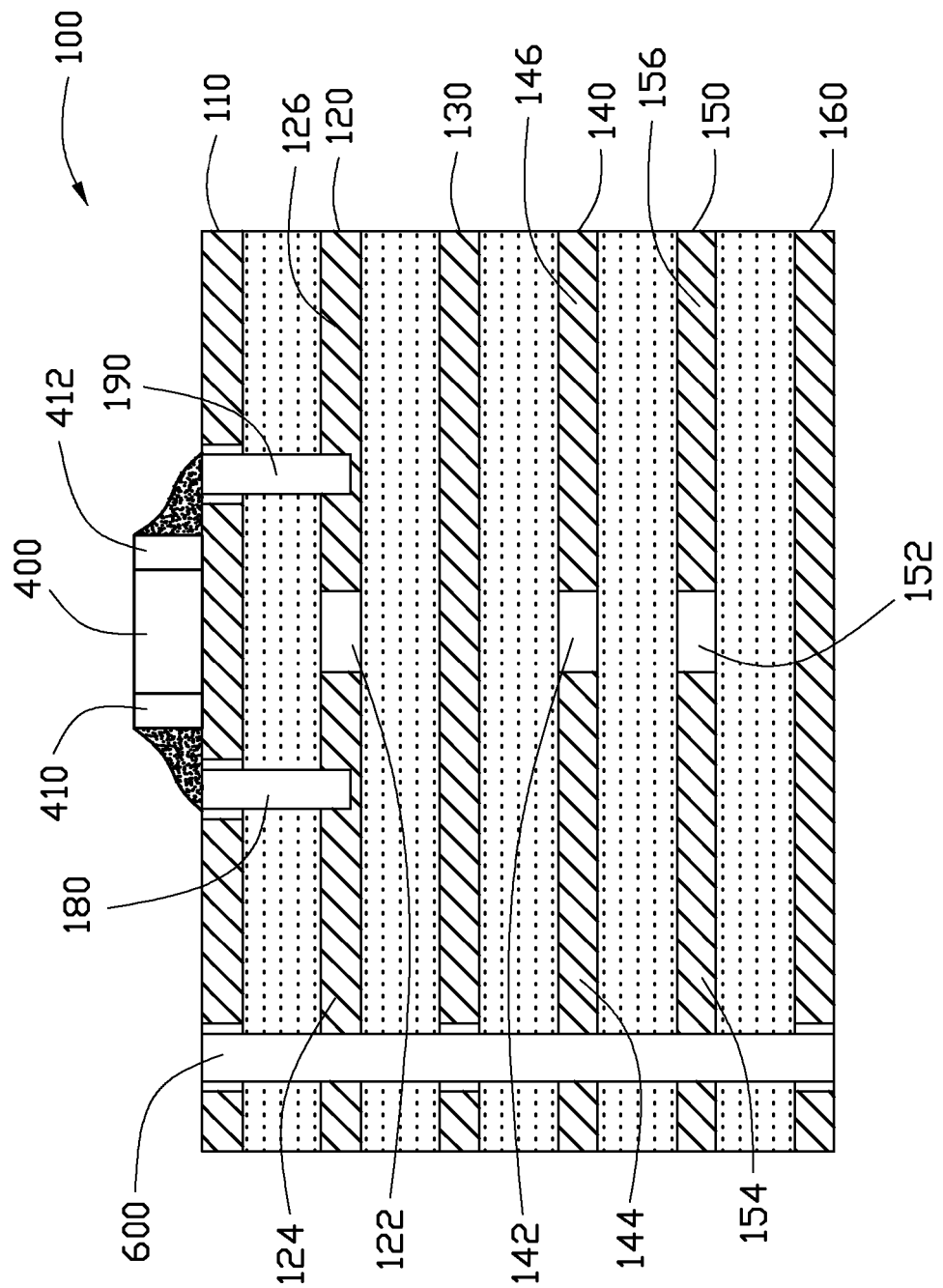
FIG. 3 is a partial, cross-sectional view of the PCB of FIG. 1.

Referring to FIGS. 1 to 3, an embodiment of a printed circuit board (PCB) 100 includes a first signal layer 110, a ground layer 120, a second signal layer 130, a power layer 140, a second ground layer 150, and a third signal layer 160.

The first signal layer 110 includes a pair of analog audio input/output (I/O) ports 200 arranged on one side of the first signal layer 110. An audio chip 300 is installed on the first signal layer 110 adjacent to the ports 200. The audio chip 300 is used to control the ports 200 to transmit or receive signals. The audio chip 300 includes a main body 310 and a plurality of signal pins extending from the main body 310. The signal pins of the audio chip 300 include a first group of signal pins 320 connected to the ports 200 through traces 14, and a second group of signal pins 330 connected to a control chip, such as a south bridge chip 500, through traces 16. It may be understood that the PCB 100 may also include other elements, such as a central processing unit. These other elements fall within well-known technologies, and are therefore not described here.

Referring to FIG. 2, the first around layer 120 is divided into two non-electrically-connected parts, namely, an audio part 124 and a digital part 126, by a dividing groove 122. The power layer 140 and the second ground layer 150 are also divided in a manner similar as the first ground layer 120, the power layer 140 includes an audio part 144 and a digital part 146 divided by a dividing groove 142, and the second ground layer 150 includes an audio part 154 and a digital part 156 divided by a dividing groove 152 (see FIG. 3). The positions of the dividing grooves 122, 142, and 152 need to satisfy the following conditions: the audio parts 124, 144, and 154 act as a whole reference plane only for the traces between the ports 200 and the audio chip 300, namely the reference plane of the traces 14 connected between the first group of signal pins 320 and the ports 200 comprises the audio parts 124, 144, and 154. The digital parts 126 and 156 are ground reference planes for the other elements of the PCB 100. The digital part 146 is a power reference plane for the other elements of the PCB 100, For example, the ground reference plane of the traces 16 comprises the digital parts 126 and 156, and thy power reference plane of the traces 16 is the digital part 146, The digital parts 126 and 156 are ground reference planes for the other elements of the PCB 100. The digital part 146 is a power reference plane for the other elements of the PCB 100. For example, the ground reference plane of the traces 16 comprises the digital parts 126 and 156, and the power reference plane of the traces 16 is the digital part 146.

Referring to FIG. 1 and FIG. 3, the PCB 100 further includes four capacitors 400. Two of the capacitors 400 are installed on the first signal layer 100 adjacent to the ports 200, and the other two of the capacitors 400 are installed on the first signal layer 100 adjacent to the audio chip 300. A first terminal 410 of each capacitor 400 is electrically connected to the audio part 124 through a via 180. A second terminal 412 of each capacitor 400 is electrically connected to the digital part 126 through a via 190. The number of the capacitors 400 can be changed according to requirements. In one embodiment, the capacitance of each of the capacitors 400 is 1000 picofarads (pF).

Furthermore, the PCB 100 defines a plurality of vias 600 for electrically connecting the audio parts 124, 144, and 154 together, which can reduce inductance.

Each of the first ground layer 120, the power layer 140, and the second ground layer 150 of the PCB 100 are divided into two non-electrically-connected parts, therefore the reference plane (audio parts 124, 144, and 154) of the traces 14 is isolated from other elements' reference planes (digital parts 126, 146, and 156), which can prevent noise signals coupling to the ports 200. Furthermore, the capacitors 400 can supply routes to conduct the noise signals of the audio part 124 to the digital part 126, which can reduce electro magnetic interference (EMI) emitted by the ports 200.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board (PCB) comprising:
a first signal layer comprising an analog audio input/output (I/O) port arranged on one side of the signal layer, and an audio chip arranged adjacent to the analog audio I/O port, wherein the audio chip comprises a main body, a first group of signal pins electrically connected to the analog audio I/O port, and a second group of signal pins electrically connected to a control chip;
a first ground layer divided into two unconnected parts, namely, a first audio part and a first digital part, by a first dividing groove;
a second signal layer;
a power layer divided into two unconnected parts, namely, a second audio part and a second digital part, by a second dividing groove, wherein the second signal layer is located between the first ground layer and the power layer; and
a second ground layer divided into two unconnected parts, namely, a third audio part and a third digital part, by a third dividing groove;
wherein the first to third audio parts act as a whole reference plane for traces between the analog audio I/O port and the first group of signal pins of the audio chip, the first to third digital parts act as reference planes for traces between the control chip and the second group of signal pins of the audio chip.

2. The PCB of claim 1, further comprising at least one capacitor comprising a first terminal and a second terminal, wherein the first terminal of the at least one capacitor is electrically connected to the first audio part of the first ground layer through a first via, the second terminal of the at least one capacitor is electrically connected to the first digital part of the first ground layer through a second via.

3. The PCB of claim 2, wherein the number of the at least one capacitor is four, two of the capacitors are installed adjacent to the analog audio I/O port, and the other two of the capacitors are installed adjacent to the audio chip.

4. The PCB of claim 2, wherein the capacitance of each of the at least one capacitor is 1000 picofarads.

5. The PCB of claim 1, further comprising a plurality of vias electrically connected to the first to third audio parts.

6. A printed circuit board (PCB) comprising:
a first signal layer comprising an analog audio input/output (I/O) port, arranged on one side of the signal layer, and an audio chip arranged adjacent to and connected to the analog audio I/O port, for controlling the analog audio I/O port to transmit or receive signals; wherein the audio chip comprises a main body, a first group of signal pins electrically connected to the analog audio I/O port, and a second group of signal pins electrically connected to a control chip;
a first ground layer divided into two non-electrically-connected parts, namely, a first audio part and a first digital part, by a first dividing groove;
a second signal layer;
a power layer divided into two non-electrically-connected parts, namely, a second audio part and a second digital part, by a second dividing groove; wherein the second signal layer is located between the first ground layer and the power layer; and
a second ground layer divided into two non-electrically-connected parts, namely, a third audio part and a third digital part, by a third dividing groove;
wherein the first to third audio parts act as a whole reference plane only for traces between the analog audio I/O port and the first group of signal pins of the audio chip, and the first to third digital parts act as reference planes for traces between the control chip and the second group of signal pins of the audio chip.

7. The PCB of claim 6, further comprising at least one capacitor comprising a first terminal and a second terminal, wherein the first terminal of the at least one capacitor is electrically connected to the first audio part of the first ground layer through a first via; and the second terminal, of the at least one capacitor, is electrically connected to the first digital part of the first ground layer through a second via.

8. The PCB of claim 7, wherein the number of the at least one capacitor is four, two of the capacitors are installed adjacent to the analog audio I/O port, and the other two of the capacitors are installed adjacent to the audio chip.

9. The PCB of claim 7, wherein the capacitance of each of the at least one capacitor is 1000 picofarads.

10. The PCB of claim 6, further comprising a plurality of vias electrically connected to the first to third audio parts.

* * * * *